United States Patent
Nagata

(10) Patent No.: US 12,550,693 B2
(45) Date of Patent: Feb. 10, 2026

(54) SEMICONDUCTOR DEVICE AND MANUFACTURING METHOD OF SEMICONDUCTOR DEVICE

(71) Applicant: FUJI ELECTRIC CO., LTD., Kanagawa (JP)

(72) Inventor: Naruhisa Nagata, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 721 days.

(21) Appl. No.: 17/727,824

(22) Filed: Apr. 25, 2022

(65) Prior Publication Data

US 2022/0415712 A1     Dec. 29, 2022

(30) Foreign Application Priority Data

Jun. 29, 2021  (JP) ................ 2021-107522

(51) Int. Cl.
   *H01L 21/768*   (2006.01)
   *H01L 23/528*   (2006.01)
   (Continued)

(52) U.S. Cl.
   CPC .... *H01L 21/76883* (2013.01); *H01L 23/5283* (2013.01); *H01L 23/53223* (2013.01); *H10D 64/01* (2025.01)

(58) Field of Classification Search
   CPC ........... H01L 21/76883; H01L 23/5283; H01L 23/53223; H01L 21/2855; H01L 21/02631;
   (Continued)

(56) References Cited

U.S. PATENT DOCUMENTS

2006/0220083 A1  10/2006  Abe
2009/0179261 A1*  7/2009  Sekiguchi ......... H01L 23/53223
                                                    257/E21.477
(Continued)

FOREIGN PATENT DOCUMENTS

JP       H0529253 A      2/1993
JP       2005347313 A   12/2005
(Continued)

OTHER PUBLICATIONS

Office Action issued for counterpart Japanese Application No. 2021-107522, transmitted from the Japanese Patent Office on May 7, 2025 (drafted on Apr. 24, 2025).

*Primary Examiner* — Sue A Purvis
*Assistant Examiner* — Jordan M Klein

(57) ABSTRACT

Provided is a manufacturing method of a semiconductor device including a semiconductor substrate, including: forming an interlayer dielectric film above the semiconductor substrate; forming contact holes exposed from a part of an upper surface of the semiconductor substrate on the interlayer dielectric film; and forming an metal electrode including an element of aluminum by DC sputtering above the interlayer dielectric film and inside the contact holes, wherein in at least a part of a process of forming the metal electrode in forming the electrode, a heating temperature that is a temperature for heating the semiconductor substrate is 400° C. or higher, and a DC sputtering power is 5 kW or lower.

16 Claims, 12 Drawing Sheets

(51) Int. Cl.
   *H01L 23/532* (2006.01)
   *H10D 64/01* (2025.01)
(58) Field of Classification Search
   CPC .......... H01L 2924/01013; H10D 64/01; H10D 64/23
   See application file for complete search history.

(56) References Cited

U.S. PATENT DOCUMENTS

2011/0097897 A1    4/2011  Tanaka
2016/0020107 A1*   1/2016  Miura ............... H01L 21/28568
                                                           438/653

FOREIGN PATENT DOCUMENTS

| | | |
|---|---|---|
| JP | 2006210511 A | 8/2006 |
| JP | 2011091242 A | 5/2011 |
| JP | 2019145667 A | 8/2019 |

* cited by examiner

SEMICONDUCTOR DEVICE AND MANUFACTURING METHOD OF SEMICONDUCTOR DEVICE

The contents of the following Japanese patent application are incorporated herein by reference:
NO. 2021-107522 filed in JP on Jun. 29, 2021.

BACKGROUND

1. Technical Field

The present invention relates to a semiconductor device, and a manufacturing method of the semiconductor device.

2. Related Art

Conventionally, the technology of "controlling the heating temperature of the semiconductor substrate and controlling the grain size (diameter) of the metal electrode" has been known in the manufacturing method of semiconductor devices. (For example, refer to Patent Document 1.)
Patent Document 1: Japanese Patent Application Publication No. 2019-145667

DESCRIPTION OF EXEMPLARY EMBODIMENTS

Figure 1:
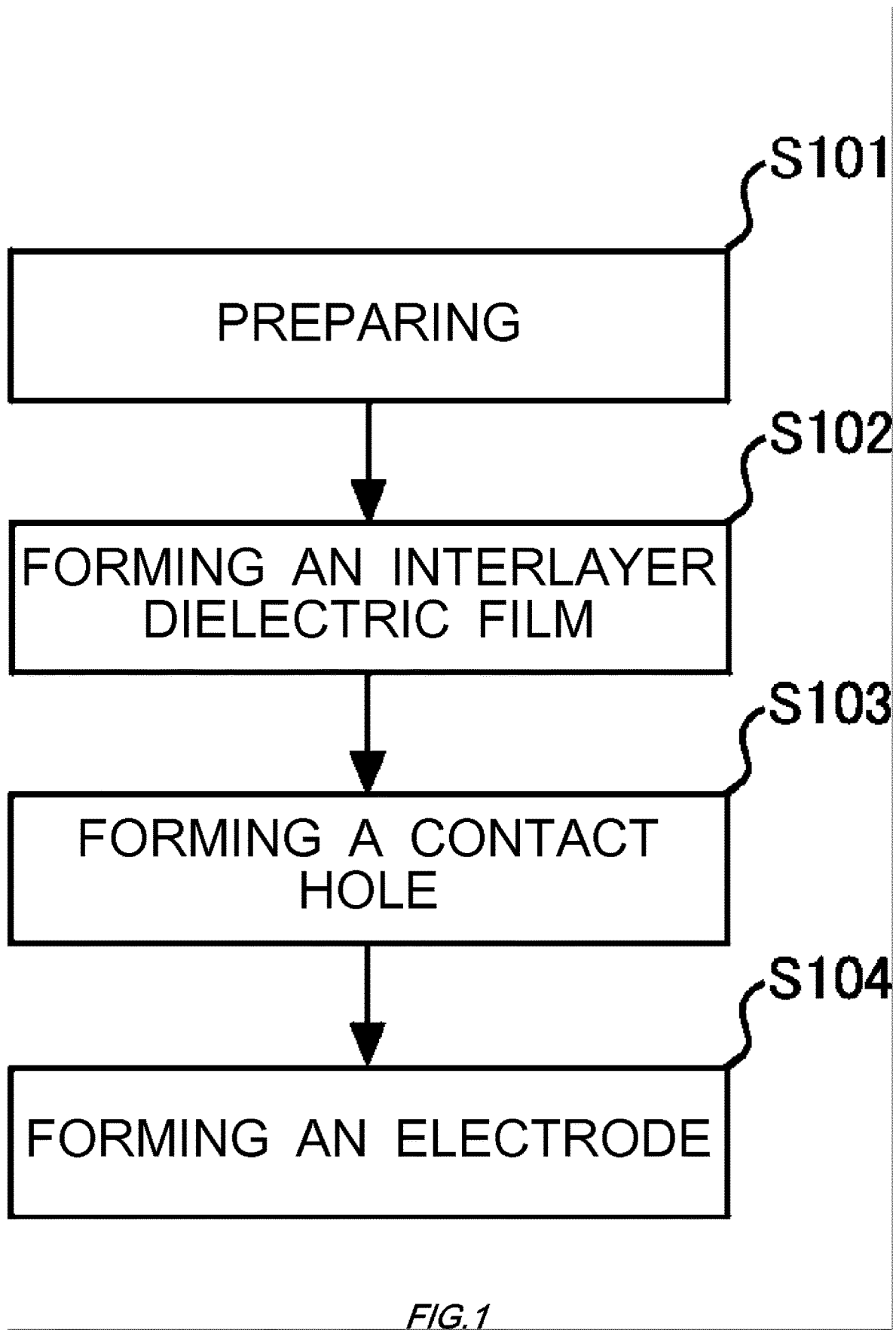
FIG. 1 illustrates one example of a flow chart of a manufacturing method of a semiconductor device 100.

Hereinafter, (some) embodiment(s) of the present invention will be described. The embodiment(s) do(es) not limit the invention according to the claims. And all the combinations of the features described in the embodiment(s) are not necessarily essential to means provided by aspects of the invention. Note that, in the present specification and the drawings, a repeated description for an element having a substantially same function and configuration is omitted by providing a same reference numeral, and illustration of an element which is not directly associated with the present invention is omitted. Also, in one drawing, for an element with an identical function or configuration, a representative sign may be attached and the other signs may be omitted.

As used herein, one side in a direction parallel to a depth direction of a semiconductor substrate is referred to as "upper" and the other side is referred to as "lower". One surface of two principal surfaces of a substrate, a layer or other member is referred to as an upper surface, and the other surface is referred to as a lower surface. An "upper" and "lower" direction is not limited to a direction of gravity, or a direction at the time in which the semiconductor module is implemented.

In the present specification, technical matters may be described using orthogonal coordinate axes of an X axis, a Y axis, and a Z axis. The orthogonal coordinate axes merely specify relative positions of components, and do not limit a specific direction. For example, the Z axis is not limited to indicate the height direction with respect to the ground. Note that a +Z axis direction and a −Z axis direction are directions opposite to each other. In a case where the positive and negative are not described and described as the Z axis direction, it means a direction parallel to the +Z axis and the −Z axis. In the present specification, orthogonal axes parallel to the upper surface and the lower surface of the semiconductor substrate are referred to as an X axis and a Y axis. Further, an axis perpendicular to the upper surface and the lower surface of the semiconductor substrate is referred to as the Z axis. In the present specification, the Z axis direction may be referred to as a depth direction. Further, in the present specification, a direction parallel to the upper surface and the lower surface of the semiconductor substrate may be referred to as a horizontal direction, including an X axis direction and a Y axis direction.

In the present specification, a case where a term such as "same" or "equal" is mentioned may include a case where an error due to a variation in manufacturing or the like is included. The error is, for example, within 10%.

Figure 2:
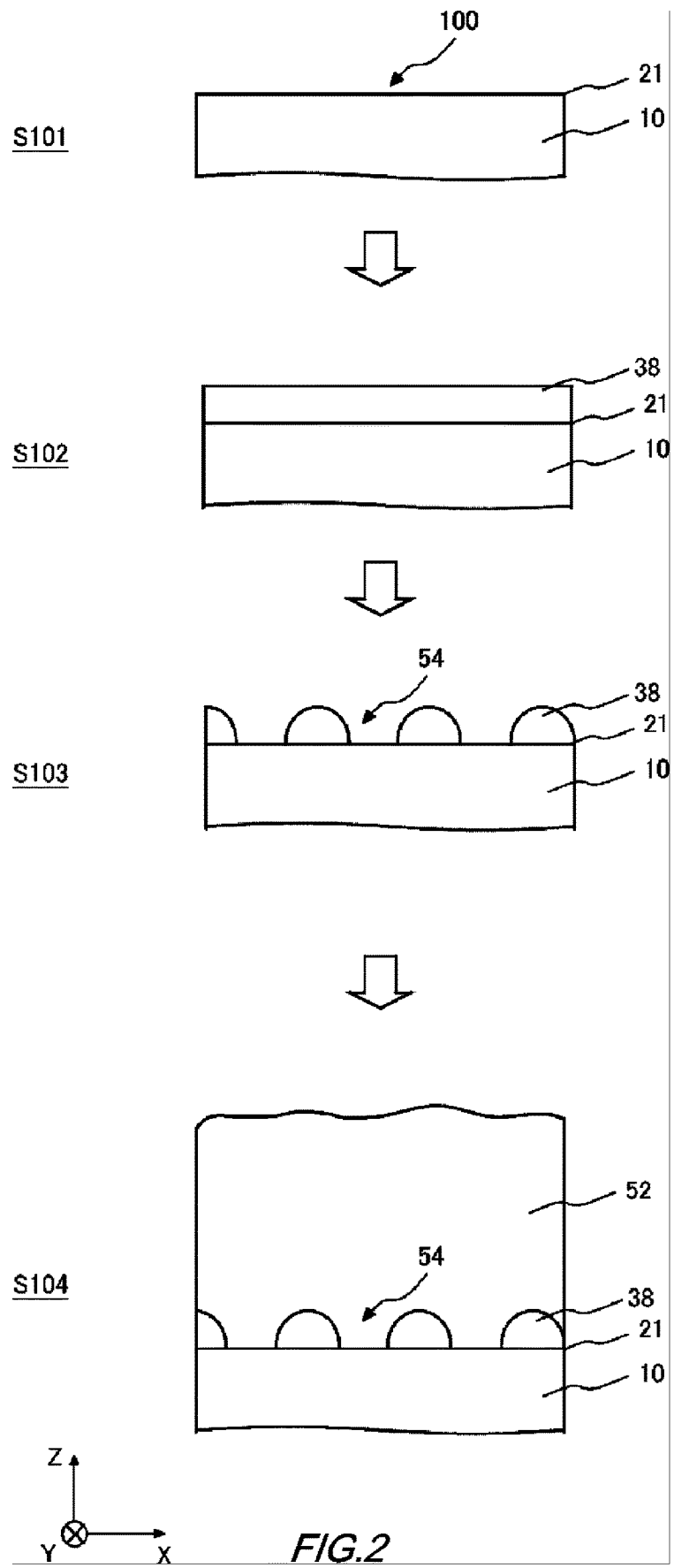
FIG. 2 illustrates an example embodiment of the manufacturing method of the semiconductor device 100.

FIG. 1 illustrates one example of a flow chart of a manufacturing method of a semiconductor device 100 (refer to FIG. 2). The manufacturing method of the semiconductor device 100 includes preparing S101, forming an interlayer dielectric film S102, forming a contact hole S103 and forming an electrode S104.

FIG. 2 illustrates an example embodiment of the manufacturing method of the semiconductor device 100. The semiconductor device 100 functions as a power conversion apparatus such as an inverter, as one example. The semiconductor device 100 may include an insulated gate bipolar transistor (IGBT), a diode such as a FWD (Free Wheel Diode), a RC(Reverse Conducting)-IGBT that is a combinations of these, or a MOS transistor or the like. The semiconductor device 100 is not limited to these examples.

First, in preparing S101, a semiconductor substrate 10 is prepared. The semiconductor device 100 includes a semiconductor substrate 10. The semiconductor substrate 10 may be a wafer including a plurality of semiconductor devices 100, or may be a substrate cut off from a wafer. The material of the semiconductor substrate 10 may be silicon (Si), or may be silicon carbide (SiC). A plurality of the semiconductor devices 100 may be manufactured by dicing a wafer-shaped semiconductor substrate 10. The semiconductor substrate 10 has an upper surface 21.

The upper surface 21 of the semiconductor substrate 10 may be a surface having a gate structure of an IGBT or a MOS transistor or the like formed thereon. The gate structure is, for example, a structure including at least one of a gate metal layer, a gate insulating film, a source region, an emitter region and a channel region. The upper surface 21 of the semiconductor substrate 10 may be a so-called device surface.

Before preparing S101, the semiconductor substrate 10 may be with a predetermined pattern formed on the upper surface 21. For example, before preparing S101, the semiconductor substrate 10 may be with a gate structure formed on the upper surface 21. Before preparing S101, injecting impurities into a predetermined region of the semiconductor substrate 10 and annealing the semiconductor substrate 10 may be performed. It should be noted that in FIG. 2, the configuration such as the gate structure provided on the upper surface 21 of the semiconductor substrate 10 is omitted.

Next, in forming the interlayer dielectric film S102, an interlayer dielectric film 38 is formed. In forming the interlayer dielectric film S102, an interlayer dielectric film 38 is formed above the semiconductor substrate 10. In the present example, an interlayer dielectric film 38 is formed above the upper surface 21 of the semiconductor substrate 10. In forming the interlayer dielectric film S102, an interlayer dielectric film 38 may be formed across the entire upper surface 21 of the semiconductor substrate 10.

The interlayer dielectric film 38 may be a film including at least one layer of an insulating film formed of silicate glass or the like with impurities such as boron or phosphorous added thereto, a thermally oxidized film and another insulating film. The interlayer dielectric film 38 may be, as one example, a BPSG (Boron Phospho Silicate Glass) film. The interlayer dielectric film 38 may be deposited by, as one example, atmospheric pressure CVD (Chemical Vapor Deposition). The interlayer dielectric film 38 may be deposited by another known method.

Next, in forming the contact hole S103, contact holes 54 is formed on the interlayer dielectric film 38. In the present example, the contact holes 54 are partially exposed from the upper surface 21 of the semiconductor substrate 10. The contact holes 54 may not be exposed from the entire upper surface 21 of the semiconductor substrate 10. By forming the contact holes 54, the interlayer dielectric film 38 is provided partially on the upper surface 21 of the semiconductor substrate 10. As one example, the interlayer dielectric film 38 is provided to cover above the gate metal layer.

The contact holes 54 may be formed by an etching process. The etching process may be a dry etching, a wet etching or the like. The etching process may be performed by a known method. In forming the contact hole S103, the etching process may be performed with a provided resist pattern. In forming the contact hole S103, a reflow treatment of the interlayer dielectric film 38 may be performed after the etching process. As one example, the reflow treatment of the interlayer dielectric film 38 is performed under a processing condition of being in a nitrogen atmosphere, with a temperature of about 1000° C. for about 25 minutes.

After forming the contact hole S103, before forming the electrode S104, a barrier metal may be deposited above the interlayer dielectric film 38. In FIG. 2, the barrier metal is omitted. The barrier metal may include Ti. The barrier metal may include TiN. The barrier metal may be a Ti and TiN lamination. When the barrier metal is a Ti and TiN lamination, the thickness of Ti may be about 50 nm, and the thickness of TiN may be about 100 nm. Herein, the thickness refers to a difference in the height between the upper surface and the lower surface in the Z axis direction. The barrier metal may be deposited by a DC magnetron sputtering apparatus.

In forming the electrode S104, a metal electrode 52 may be formed. The metal electrode 52 may be a so-called main electrode of the semiconductor device 100. The main electrode may refer to an electrode with the largest area among the electrodes arranged above the upper surface 21 of the semiconductor substrate 10 in a top view. The main electrode, for example, may be connected electrically to the emitter region or the source region of the transistor portion, or may be connected electrically to the anode region of the diode portion.

The metal electrode 52 may be provided above the interlayer dielectric film 38. In the present example, the metal electrode 52 may be provided to cover the interlayer dielectric film 38. Also, the metal electrode 52 may be provided inside the contact hole 54. In the present example, the contact holes 54 are filled with the metal electrode 52.

Figure 3:
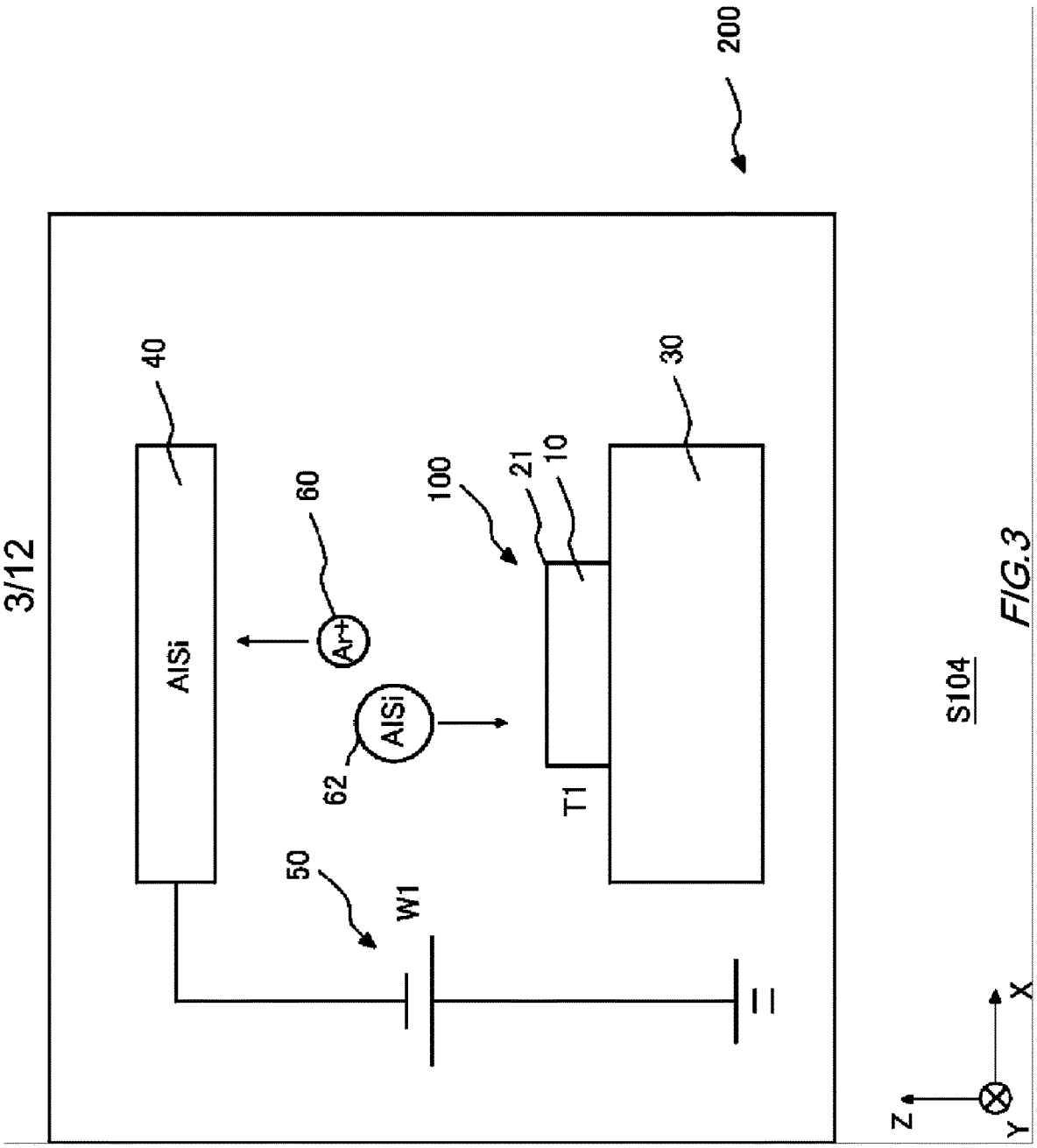
FIG. 3 illustrates forming an electrode S104.

FIG. 3 illustrates forming the electrode S104. Forming the electrode S104 is performed by an apparatus 200. In FIG. 3, the apparatus 200 is illustrated schematically. The apparatus 200 may be a sputtering apparatus. The apparatus 200 of the present example may be a DC sputtering apparatus such as a DC magnetron sputtering apparatus. In forming the electrode S104, the metal electrode 52 may be formed by the DC sputtering.

The apparatus 200 includes a support stand 30, a target 40 and a power source 50. In forming the electrode S104, the semiconductor device 100 may be placed above the support stand 30. In the present example, the semiconductor device 100 is placed in contact with the upper surface of the support stand 30. Also, since the apparatus 200 is a DC magnetron sputtering apparatus, the apparatus 200 may include a magnet (not illustrated) for generating a magnetic force.

The target 40 refers to the material of the metal electrode 52. In the present example, the target 40 includes an element of aluminum. That is, the metal electrode 52 includes an element of aluminum. The target 40 may be AlSi. The element of aluminum of the target 40 may be 90 wt % or more.

The power source 50 applies the power. In the present example, power is applied to the anode connected to the ground and the cathode connected to the target 40. The support stand 30 may become to be with a float potential. The power applied by the power source 50 is referred to as a DC sputtering power W1.

In forming the electrode S104, in forming the metal electrode 52, a vacuum is firstly created inside the apparatus 200. Inside the apparatus 200, a vacuum is created by a vacuum pump or the like. After creating a vacuum inside the apparatus 200, introducing a trace amount of gas into the apparatus 200. In the present example, the gas is the argon gas. After introducing the gas, the gas pressure inside the apparatus 200 is, as one example, 0.3 Pa. The gas pressure inside the apparatus 200 may be about 0.3 Pa.

By applying power by the power source 50, the element of argon discharges and becomes positive ions (argon ions 60), generating plasmas. Then the argon ions 60 are drawn toward the target 40 that is the cathode, and collide with the target 40. Therefore, AlSi molecules (molecules 62) are released from the target 40. The released molecules 62 can attach onto the semiconductor device 100 facing to them, thereby forming a metal electrode 52 on the semiconductor device 100.

In forming the electrode S104, the semiconductor substrate 10 is heated. The temperature of heating the semiconductor substrate 10 is referred to as a heating temperature Ti. In the present example, the semiconductor substrate 10 is heated via the support stand 30. That is, the semiconductor substrate 10 may be heated by taking the temperature of the upper surface of the support stand 30 as the heating temperature Ti.

In the present example, the heating temperature T1 refers to a temperature of 400° C. or higher. By making the heating temperature Ti 400° C. or higher, the grain growth during deposition can be facilitated, thereby the embedability can be improved. The heating temperature T1 in the present example is 430° C. Further, if the heating temperature is too high, the burden on the apparatus 200 increases and the properties of the apparatus 200 may degrade. The heating temperature Ti is preferred to be 500° C. or lower.

Also in the present example, in forming the electrode S104, the DC sputtering power W1 may be 5 kW or lower. By decreasing the DC sputtering power W1, the deposition rate can be decreased. Accordingly, if the deposition time becomes longer, the flatness of the metal electrode 52 can be improved by the reflow effect. When the DC sputtering power W1 is 5 kW or lower, the deposition rate of the DC sputtering may be 8 nm/sec or less. The DC sputtering power W1 of the present example is 3 kW. In this case, the deposition rate is 5 nm/sec. Also, in order to ensure the minimal deposition rate, the DC sputtering power is preferred to be 0.5 kW or higher.

In at least a part of the process of forming the metal electrode 52 in forming the electrode S104, the heating temperature T1 may be 400° C. or higher, and the DC sputtering power W1 may be 5 kW or lower. In the present example, in the entire process of forming the metal electrode 52 in forming the electrode S104, the heating temperature Ti is 400° C. or higher, and the DC sputtering power W1 is 5 kW or lower.

Figure 4:
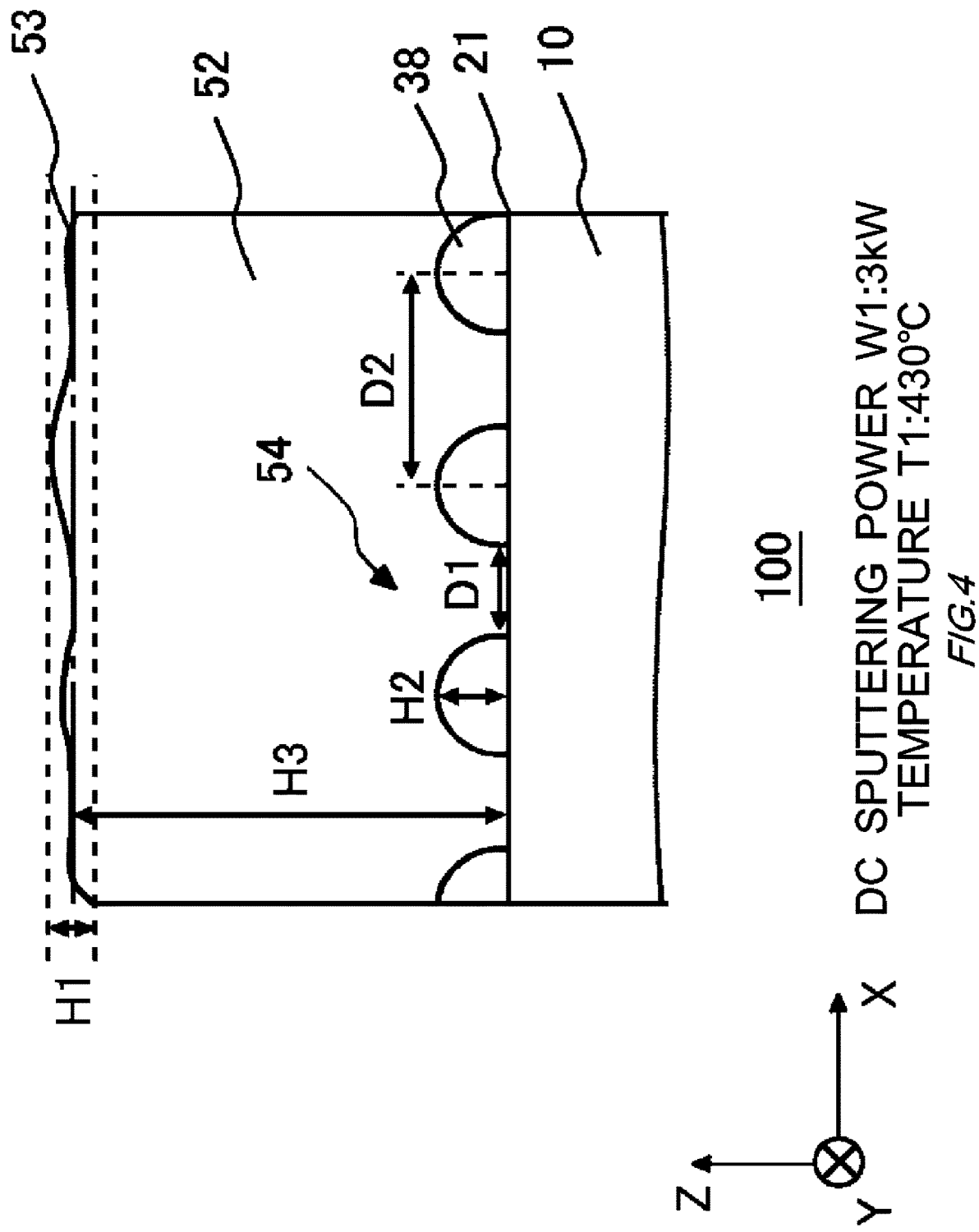
FIG. 4 illustrates one example of the semiconductor device 100 in an example embodiment.

FIG. 4 illustrates one example of the semiconductor device 100 in an example embodiment. FIG. 4 illustrates the semiconductor device 100 after forming the electrode S104. The condition in the example embodiment is that the DC sputtering power W1 is 3 kW, and the temperature T1 is 430° C. Further, the gas pressure is 0.3 Pa. Further, the thickness of the metal electrode 52 (the thickness H3 in FIG. 4) is deposited to become 5.0 µm.

The concavo-convex H1 of the upper surface 53 of the metal electrode 52 may be one half or less of the thickness H2 of the interlayer dielectric film 38. The concavo-convex H1 of the upper surface 53 of the metal electrode 52 may be a difference in the height between the part with the maximum height of the upper surface 53 of the metal electrode 52 and the part with a minimum height of the upper surface 53 of the metal electrode 52. The thickness H2 of the interlayer dielectric film 38 may be the difference in the height between the part with a maximum height of the upper surface of the interlayer dielectric film 38 and the part with a minimum height of the lower surface of the interlayer dielectric film 38. By making the DC sputtering power W1 5 kW or lower, the concavo-convex H1 of the upper surface 53 of the metal electrode 52 can be one half or less of the thickness H2 of the interlayer dielectric film 38, thereby the flatness of the metal electrode 52 can be improved.

Also, as another condition, the thickness H3 of the metal electrode 52 may be 7.0 µm or less. The thickness H3 of the metal electrode 52 may be an average thickness of the metal electrode 52 (illustrated by a dashed-dotted line). The thickness H3 of the metal electrode 52 is deposited to become 5.0 µm, as one example. The diameter D1 of the contact hole may be 1.5 µm or less. Also, the center-to-center distance D2 (cell pitch) of the adjacent interlayer dielectric films 38 may be 3.5 µm or less. Under such a condition, the flatness of the metal electrode 52 can be improved.

The concavo-convex H1 of the upper surface 53 of the metal electrode 52 may be 0.5 µm or less. The concavo-convex H1 of the upper surface 53 of the metal electrode 52 may be 0.25 µm or less. To improve the flatness of the metal electrode 52, the less the concavo-convex H1 of the upper surface 53 of the metal electrode 52, the better. In FIG. 4, the concavo-convex H1 of the upper surface 53 of the metal electrode 52 is 0.3 µm. Also, the thickness H2 of the interlayer dielectric film 38 may be 0.5 µm or more. The thickness H2 of the interlayer dielectric film 38 may be 1.0 µm or more.

Figure 5:
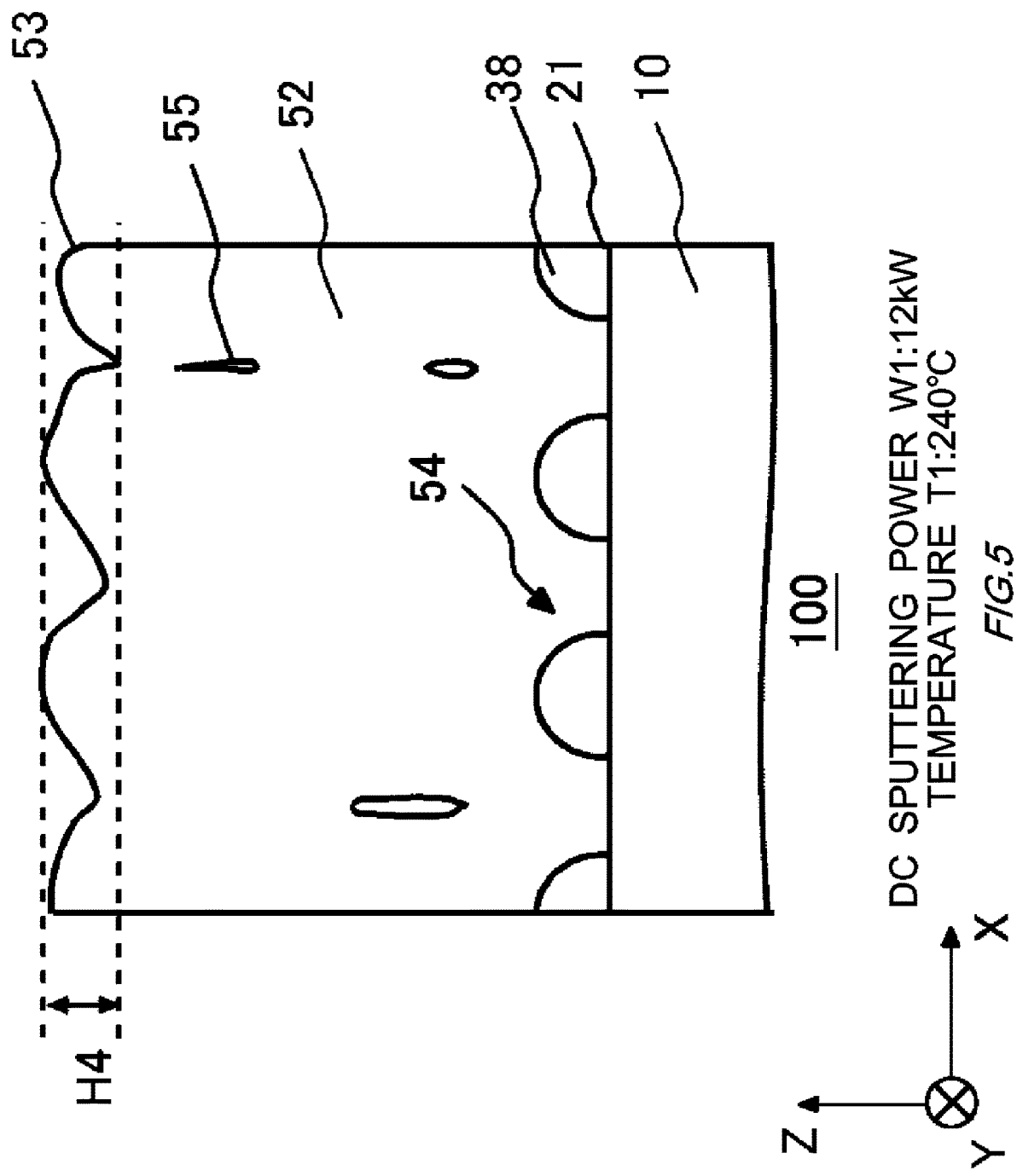
FIG. 5 illustrates one example of the semiconductor device 100 in a comparative example.

FIG. 5 illustrates one example of the semiconductor device 100 in the comparative example FIG. 5 illustrates the semiconductor device 100 after forming the electrode S104, similar to FIG. 4. The condition in FIG. 5 is that the DC sputtering power W1 is 12 kW, and the temperature T1 is 240° C. The other conditions in FIG. 5 may be identical to the conditions in FIG. 4.

The concavo-convex H4 of the upper surface 53 of the metal electrode 52 in FIG. 5 is 0.8 µm. Accordingly, the flatness is worse than that of the semiconductor device 100 in FIG. 4. Also, since an air gap 55 is generated, the contact holes 54 are not embedded, so the embedability is worse than that of the semiconductor device 100 in FIG. 4. The air gap 55 refers to the air gap generated in the metal electrode 52.

Figure 6:
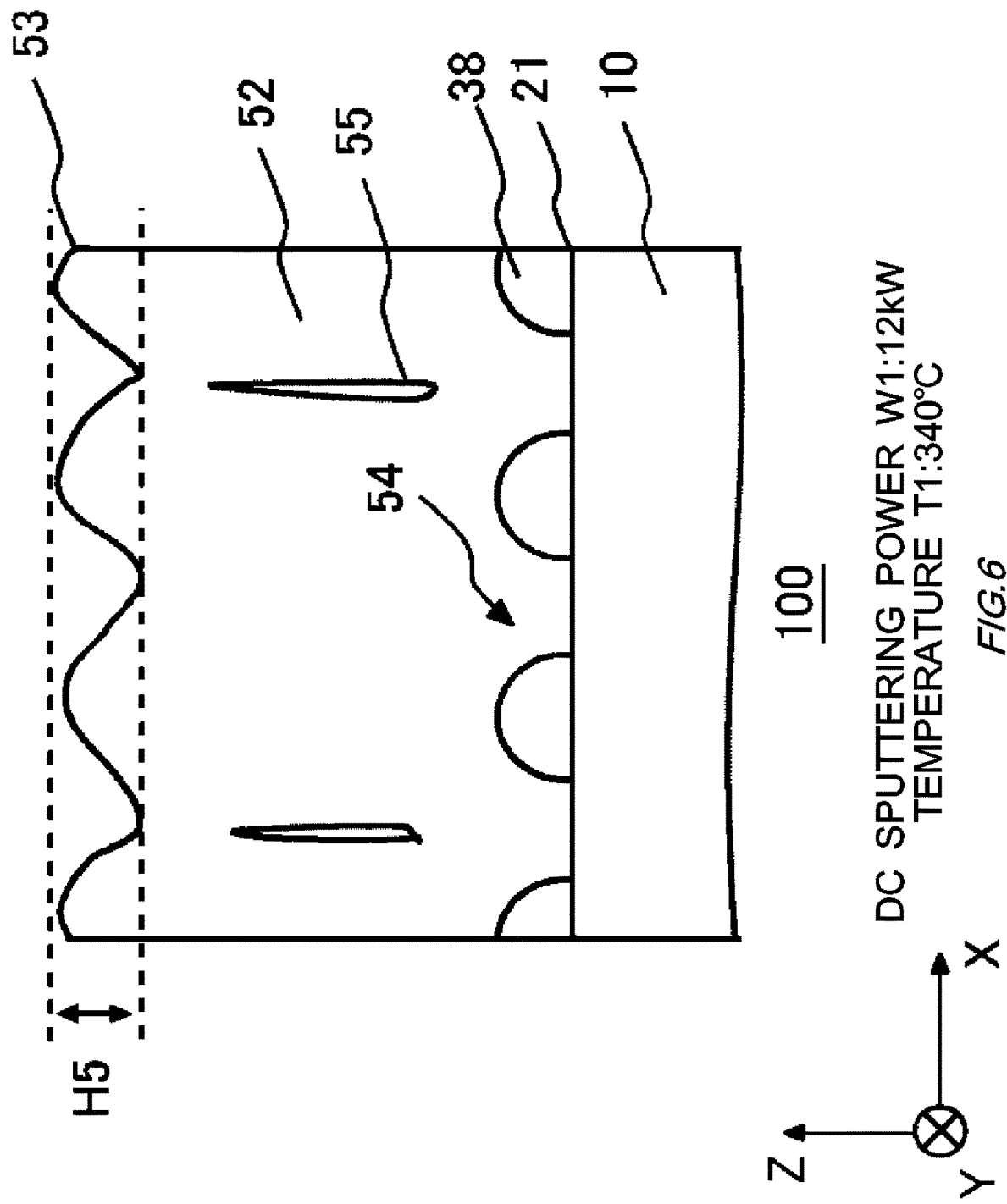
FIG. 6 illustrates another example of the semiconductor device 100 in the comparative exampl.

FIG. 6 illustrates another example of the semiconductor device 100 in the comparative example FIG. 6 illustrates the semiconductor device 100 after forming the electrode S104, similar to FIG. 4. The condition in FIG. 6 is that, the DC sputtering power W1 is 12 kW, and the temperature T1 is 340° C. The other conditions in FIG. 6 may be identical to the conditions in FIG. 4.

The concavo-convex H5 of the upper surface 53 of the metal electrode 52 in FIG. 6 is 1.0 µm. Accordingly, the flatness is worse than that of the semiconductor device 100 in FIG. 4. Also, since an air gap 55 is generated, the contact holes 54 are not embedded, so the embedability is worse than that of the semiconductor device 100 in FIG. 4.

Figure 7:
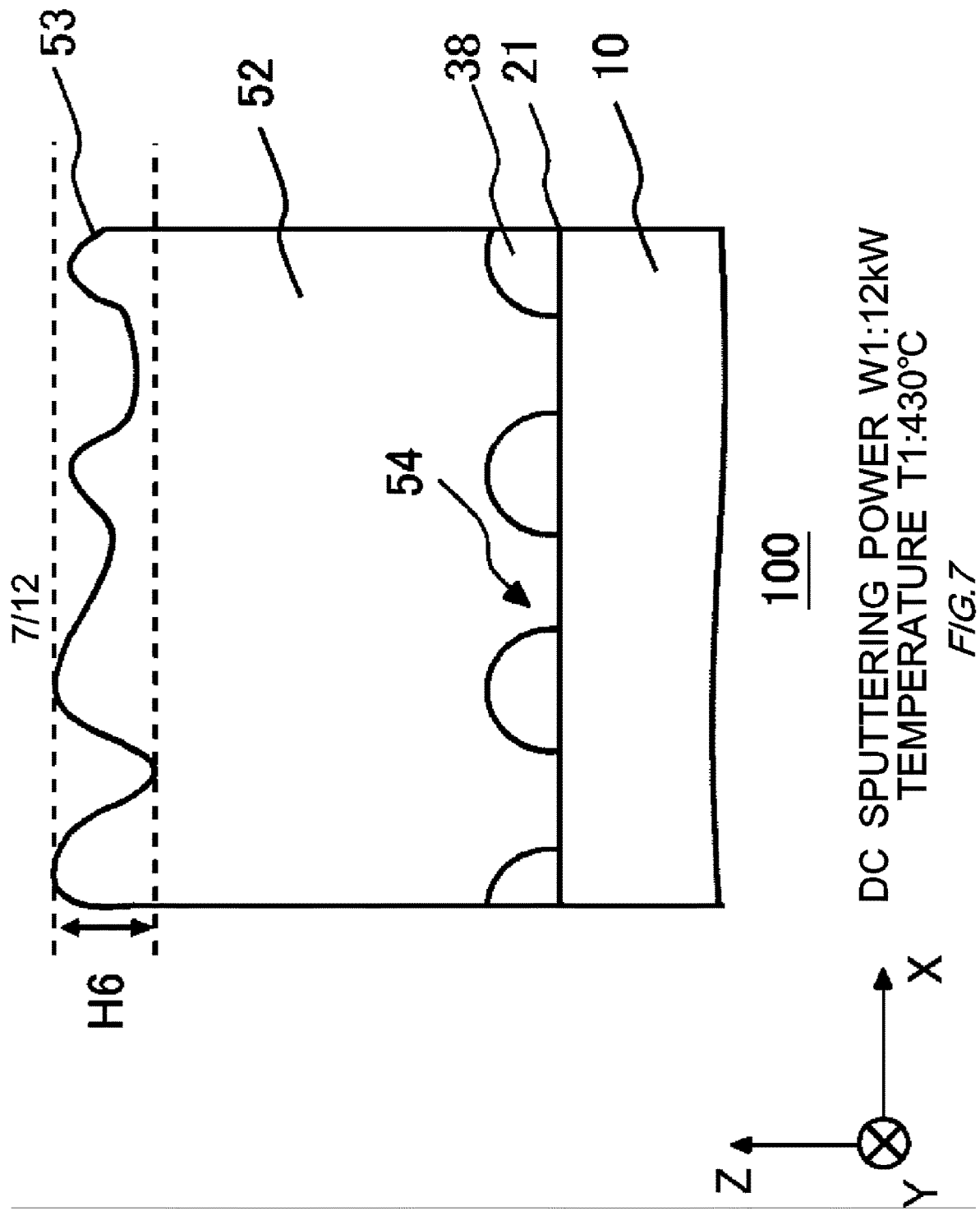
FIG. 7 illustrates another example of the semiconductor device 100 in the comparative exampl.

FIG. 7 illustrates another example of the semiconductor device 100 in the comparative example FIG. 7 illustrates the semiconductor device 100 after forming the electrode S104, similar to FIG. 4. The condition in FIG. 7 is that the DC sputtering power W1 is 12 kW, and the temperature T1 is 430° C. The other conditions in FIG. 7 may be identical to the conditions in FIG. 4.

The concavo-convex H6 of the upper surface 53 of the metal electrode 52 in FIG. 7 is 1.3 µm. Accordingly, the flatness is worse than that of the semiconductor device 100 in FIG. 4. Also, in the present example, no air gap is generated, and the contact holes 54 are embedded.

Figure 8:
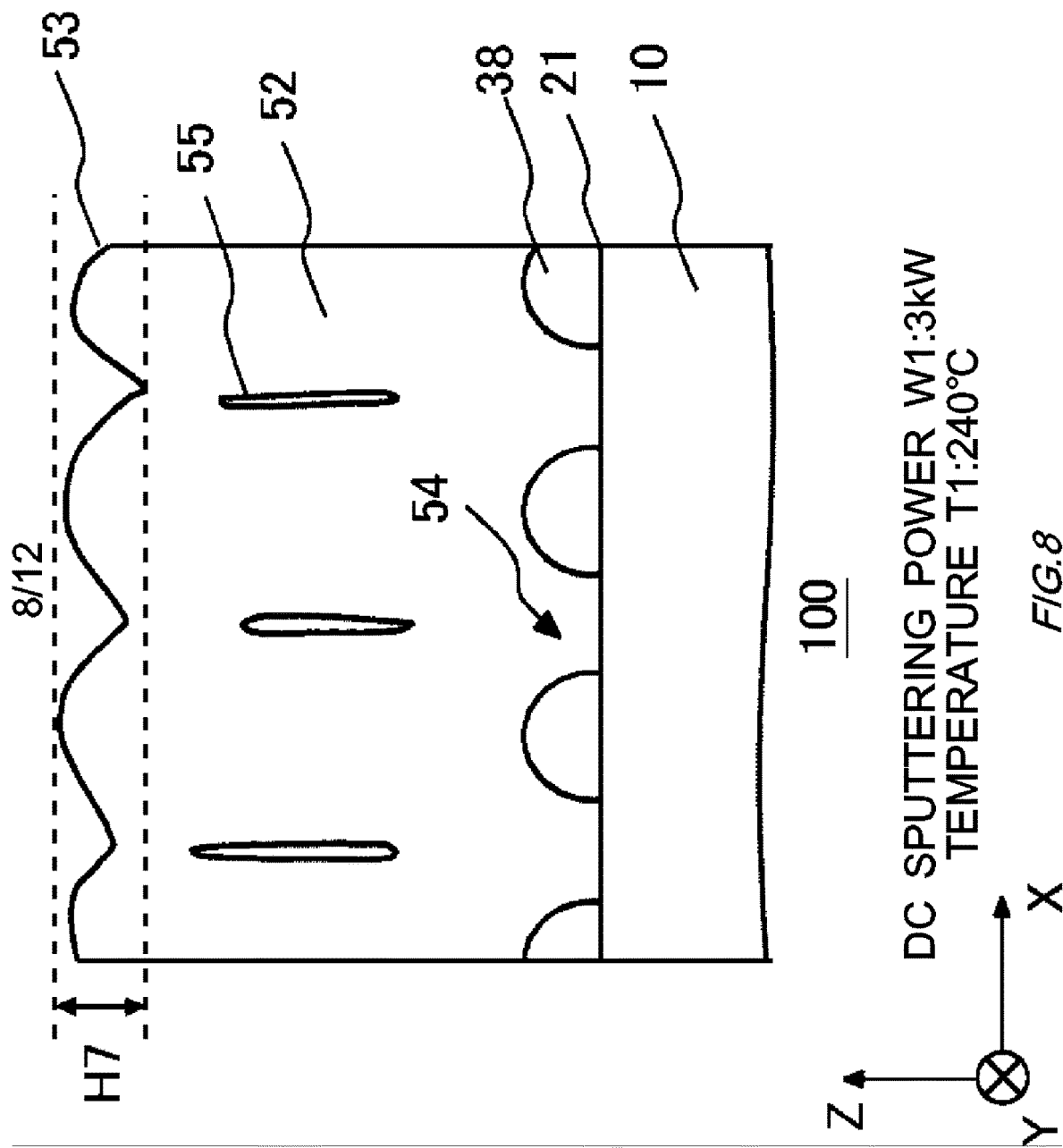
FIG. 8 illustrates another example of the semiconductor device 100 in the comparative exampl.

FIG. 8 illustrates another example of the semiconductor device 100 in the comparative example FIG. 8 illustrates the semiconductor device 100 after forming the electrode S104, similar to FIG. 4. The condition in FIG. 8 is that the DC sputtering power W1 is 3 kW, and the temperature T1 is 240° C. The other conditions in FIG. 8 may be identical to the conditions in FIG. 4.

The concavo-convex H7 of the upper surface 53 of the metal electrode 52 in FIG. 8 is 0.8 µm. Accordingly, the flatness is worse than that of the semiconductor device 100 in FIG. 4. Also, since an air gap 55 is generated, the contact holes 54 are not embedded, so the embedability is worse than that of the semiconductor device 100 in FIG. 4.

Figure 9:
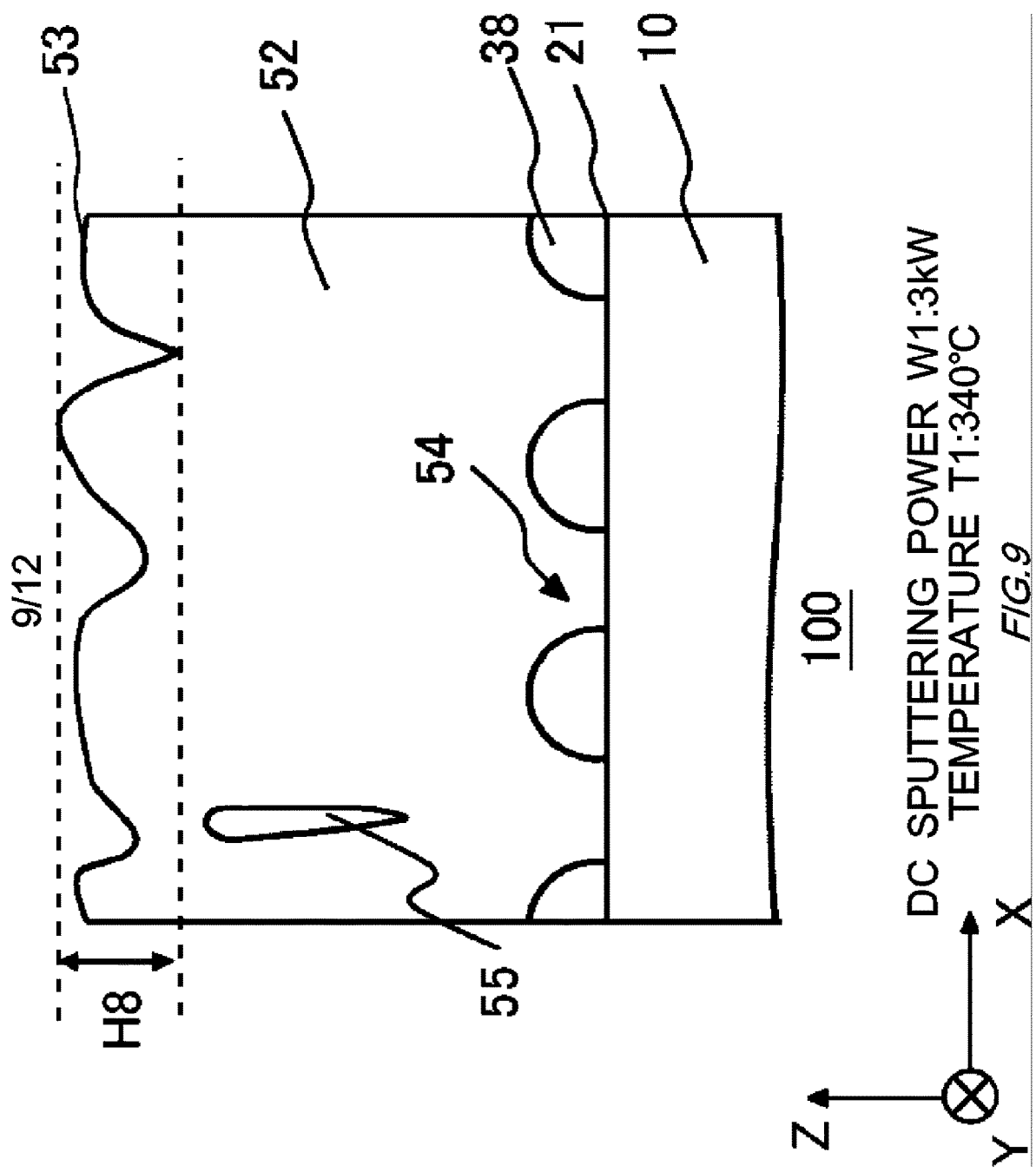
FIG. 9 illustrates another example of the semiconductor device 100 in the comparative exampl.

FIG. 9 illustrates another example of the semiconductor device 100 in the comparative example FIG. 9 illustrates the semiconductor device 100 after forming the electrode S104, similar to FIG. 4. The condition in FIG. 9 is that the DC sputtering power W1 is 3 kW, and the temperature T1 is 340° C. The other conditions in FIG. 9 may be identical to the conditions in FIG. 4.

The concavo-convex H8 of the upper surface 53 of the metal electrode 52 in FIG. 9 is 1.0 µm. Accordingly, the flatness is worse than that of the semiconductor device 100 in FIG. 4. Also, since an air gap 55 is generated, the contact holes 54 are not embedded, so the embedability is worse than that of the semiconductor device 100 in FIG. 4.

To summarize the above-mentioned FIG. 4 to FIG. 9, by making the heating temperature T1 400° C. or higher, and the DC sputtering power W1 5 kW or lower, the embedability of the metal electrode 52 can be better, and the flatness of the metal electrode 52 can be improved. Accordingly, failures due to the metal electrode 52 can become less, and the reasons of malfunction of the semiconductor device 100 can be reduced.

Figure 10:
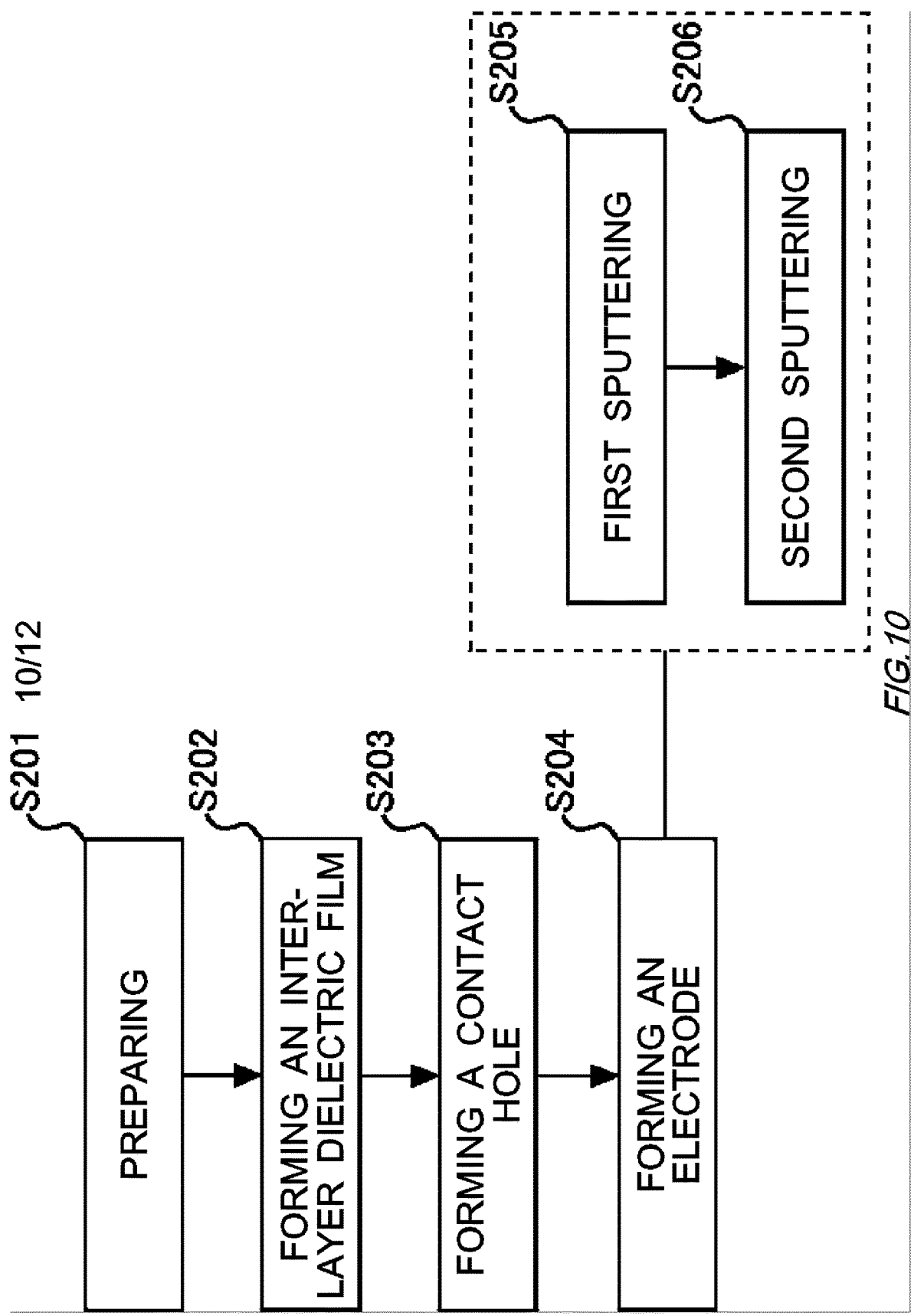
FIG. 10 illustrates another example of the flow chart of the manufacturing method of the semiconductor device 100.

FIG. 10 illustrates another example of the flow chart of the manufacturing method of the semiconductor device 100. The manufacturing method of the semiconductor device 100 includes preparing S201, forming an interlayer dielectric film S202, forming a contact hole S203 and forming an electrode S204. Preparing S201, forming the interlayer dielectric film S202, and forming the contact hole S203 in FIG. 10 may be identical to preparing S101, forming the interlayer dielectric film S102 and forming the contact hole S103 in FIG. 1.

In the present example, forming the electrode S204 includes a first sputtering S205 and a second sputtering S206. That is, in forming the electrode S204, the condition is changed and the metal electrode 52 is formed in two steps. In detail, in the first sputtering S205 and the second sputtering S206, the heating temperature or the DC sputtering power is changed. The heating temperature in the first sputtering S205 is referred to as T2, and the DC sputtering power in the first sputtering S205 is referred to as W2. Also, the heating temperature in the second sputtering S206 is referred to as T3, and the DC sputtering power in the second sputtering S206 is referred to as W3.

Figure 11:
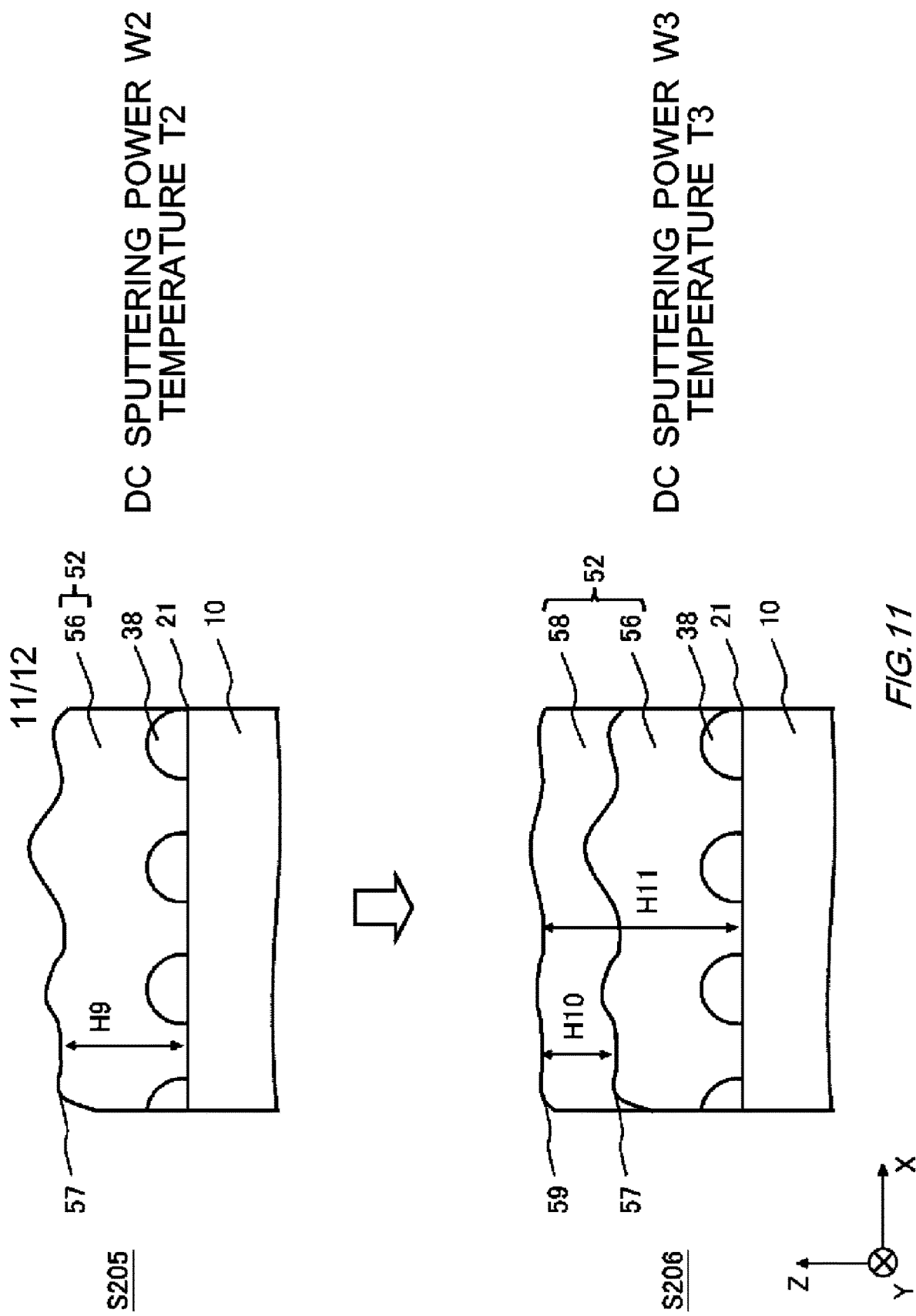
FIG. 11 illustrates one example of a first sputtering S205 and a second sputtering S206.

FIG. 11 illustrates one example of the first sputtering S205 and the second sputtering S206. In the first sputtering S205, the first electrode layer 56 is formed. The first electrode layer 56 is a part of the metal electrode 52. That is, the first electrode layer 56 includes an element of aluminum. Also, in the second sputtering S206, the second electrode layer 58 is formed. The second electrode layer 58 is a part of the metal electrode 52. That is, the second electrode layer 58 includes an element of aluminum. In the present example, the metal electrode 52 is a lamination of the first electrode layer 56 and the second electrode layer 58.

In the present example, in at least one of the first sputtering S205 and the second sputtering S206, the heating temperature is 400° C. or higher, and the DC sputtering power is 5 kW or lower. In FIG. 11, in the second sputtering S206, the heating temperature T3 is 400° C. or higher, and the DC sputtering power W3 is 5 kW or lower. By setting the condition of the second sputtering S206 in this way, the embedability of the metal electrode 52 can be better, and the flatness of the metal electrode 52 can be improved.

Also, in the first sputtering S205, the DC sputtering power W2 may be 5 kW or higher. By making the DC sputtering power W2 5 kW or higher, the deposition rate can be increased, and the throughput can be improved. In this case, the concavo-convex of the upper surface 57 of the first electrode layer 56 may be greater than the concavo-convex of the upper surface 59 of the second electrode layer 58. Also, to improve the embedability, also in the first sputtering S205, the heating temperature T2 is preferred to be 400° C. or higher. The heating temperature T2 and the heating temperature T3 may be the same temperature.

In the first sputtering S205, the first electrode layer 56 may be formed up to the upper end of the interlayer dielectric film 38. In the present example, the thickness H9 of the first electrode layer is one half or more of the thickness H11 of the metal electrode 52. The thickness H9 of the first electrode layer may be ⅔ of the thickness H11 of the metal electrode 52. The thickness H9 of the first electrode layer may be 2.5 µm or more. The thickness H10 of the second electrode layer may be 2.5 µm or less. The thickness H11 of the metal electrode 52 is, as one example, 5.0 µm. It should be noted that the thickness H9 of the first electrode layer, the thickness H10 of the second electrode layer, and the thickness H11 of the metal electrode 52 may be an average thickness. The thickness H9 of the first electrode layer, the thickness H10 of the second electrode layer, and the thickness H11 of the metal electrode 52 may be the thickness in the Z axis direction of a position where contact holes 54 are provided.

Also, based on the heating temperature, the percentage of the thickness H9 of the first electrode layer 56 and the thickness H10 of the second electrode layer 58 can be changed. For example, the higher the heating temperature T2 and the heating temperature T3 are, the less the percentage of the thickness H10 of the second electrode layer 58 to the thickness H9 of the first electrode layer 56 can be. The higher the heating temperature T2 and the heating temperature T3 are, the embedability and the flatness become relatively better. Accordingly, by increasing the heating temperature T2 and the heating temperature T3, the flatness can be improved even the deposited amount of the second sputtering S206 is reduced. Since the electrode layer 52 deposited with a higher heating temperature becomes flat faster in the second sputtering S206, the deposited amount of the first sputtering S205 with a high deposition rate can be increased.

Figure 12:
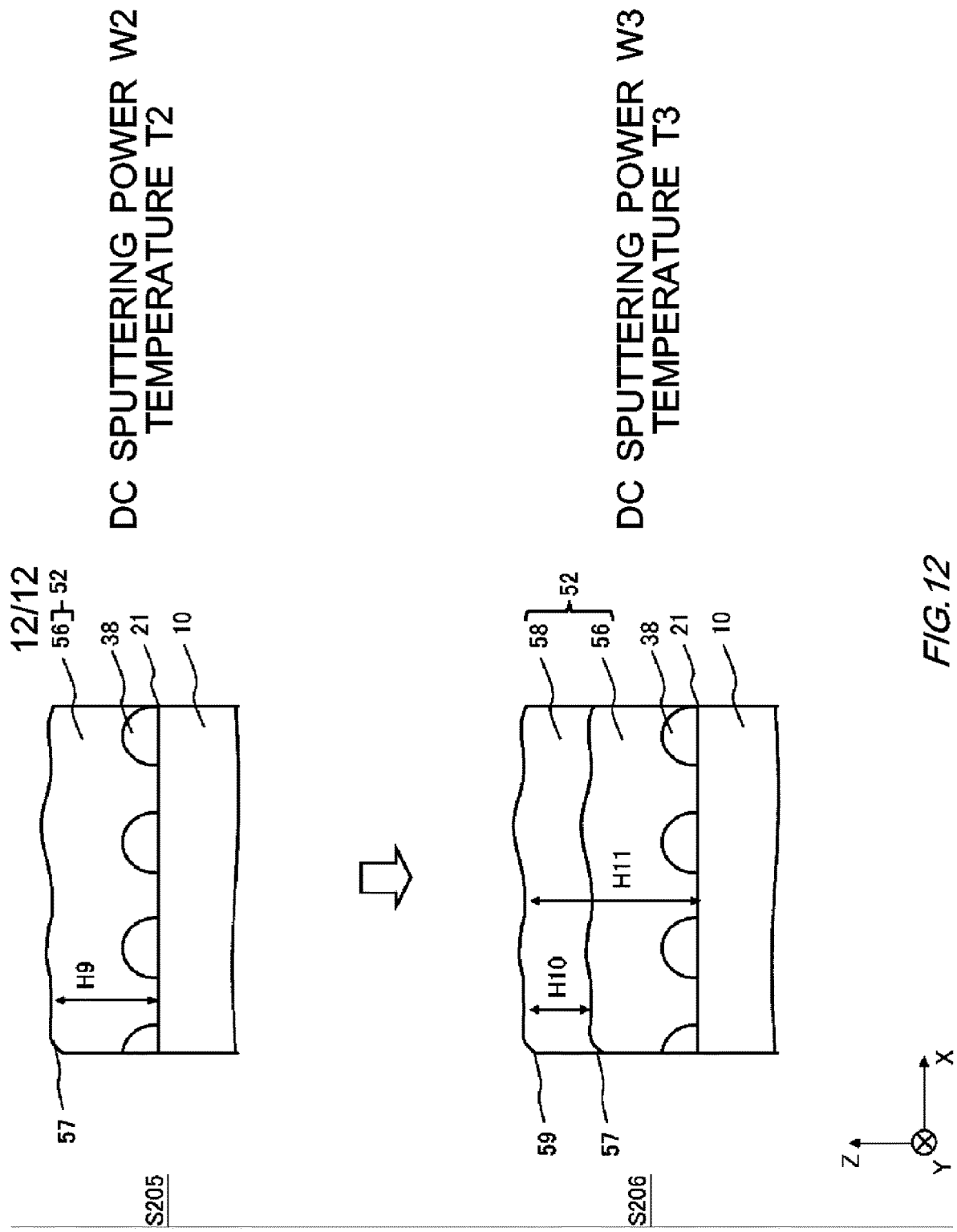
FIG. 12 illustrates another example of the first sputtering S205 and the second sputtering S206.

FIG. 12 illustrates another example of the first sputtering S205 and the second sputtering S206. In the first sputtering S205, the first electrode layer 56 is formed. Also, in the second sputtering S206, the second electrode layer 58 is formed. In FIG. 12, the deposition conditions of the first sputtering S205 and the second sputtering S206 are changed compared with FIG. 11.

Also in the present example, in at least one of the first sputtering S205 and the second sputtering S206, the heating temperature is 400° C. or higher, and the DC sputtering power is 5 kW or lower. In FIG. 12, in the first sputtering S205, the heating temperature T2 is 400° C. or higher, and the DC sputtering power W2 is 5 kW or lower. By setting the condition of the first sputtering S205 in this way, the embedability of the metal electrode 52 can be better, and the flatness of the metal electrode 52 can be improved. To improve the embedability of the metal electrode 52 after the second sputtering S206, in the second sputtering S206, the heating temperature T3 is preferred to be 400° C. or higher, and the DC sputtering power W3 is preferred to be 5 kW or higher. By making the DC sputtering power W3 5 kW or higher, the deposition rate can be increased, and the throughput can be improved.

Also, based on the heating temperature, the percentage of the thickness H9 of the first electrode layer 56 and the thickness H10 of the second electrode layer 58 can be changed. For example, the higher the heating temperature T2 and the heating temperature T3 are, the more the percentage of the thickness H10 of the second electrode layer 58 to the thickness H9 of the first electrode layer 56 can be. The higher the heating temperature T2 and the heating temperature T3 are, the embedability and the flatness become relatively better. Accordingly, by increasing the heating temperature T2 and the heating temperature T3, the flatness can be improved even the deposited amount of the first sputtering S205 is reduced. Since the electrode layer 52 deposited with a higher heating temperature becomes flat faster in the first sputtering S205, the deposited amount of the second sputtering S206 with a high deposition rate can be increased.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

What is claimed is:

1. A manufacturing method of a semiconductor device including a semiconductor substrate, comprising:
   forming an interlayer dielectric film above the semiconductor substrate;
   forming contact holes that expose a part of an upper surface of the semiconductor substrate through the interlayer dielectric film; and
   forming a metal electrode including an element of aluminum by DC sputtering above the interlayer dielectric film and inside the contact holes,
   wherein the metal electrode including an element of aluminum directly contacts the part of the upper surface of the semiconductor substrate, and
   wherein in at least a part of a process of forming the metal electrode, a heating temperature that is a temperature for heating the semiconductor substrate is 400° C. or higher, and a DC sputtering power is 5 KW or lower.

2. The manufacturing method of a semiconductor device according to claim 1, wherein the heating temperature is 500° C. or lower.

3. The manufacturing method of a semiconductor device according to claim 2, wherein the DC sputtering power is 0.5 KW or higher.

4. The manufacturing method of a semiconductor device according to claim 2,
   wherein forming the metal electrode includes:
   a first sputtering, by DC sputtering, for forming a first electrode layer that is a part of the metal electrode, including an element of aluminum; and
   a second sputtering, after the first sputtering, by DC sputtering, for forming a second electrode layer that is a part of the metal electrode, including an element of aluminum,
   wherein in at least one of the first sputtering and the second sputtering, the heating temperature is 400° C. or higher, and the DC sputtering power is 5 KW or lower.

5. The manufacturing method of a semiconductor device according to claim 1, wherein the DC sputtering power is 0.5 KW or higher.

6. The manufacturing method of a semiconductor device according to claim 1,
   wherein forming the metal electrode includes:
   a first sputtering, by DC sputtering, for forming a first electrode layer that is a part of the metal electrode, including an element of aluminum; and
   a second sputtering, after the first sputtering, by DC sputtering, for forming a second electrode layer that is a part of the metal electrode, including an element of aluminum,
   wherein in at least one of the first sputtering and the second sputtering, the heating temperature is 400° C. or higher, and the DC sputtering power is 5 KW or lower.

7. The manufacturing method of a semiconductor device according to claim 6, wherein in the second sputtering, the heating temperature is 400° C. or higher, and the DC sputtering power is 5 KW or lower.

8. The manufacturing method of a semiconductor device according to claim 7, wherein in the first sputtering, the heating temperature is 400° C. or higher, and the DC sputtering power is 5 KW or higher.

9. The manufacturing method of a semiconductor device according to claim 8, wherein a percentage of thickness of the first electrode layer and the second electrode layer, with respect to the total thickness of the metal electrode, depends on the heating temperature.

10. The manufacturing method of a semiconductor device according to claim 9, wherein the higher the heating temperature is, the less the percentage of thickness of the second electrode layer to the first electrode layer is.

11. The manufacturing method of a semiconductor device according to claim 7, wherein in the first sputtering, the first electrode layer is formed up to an upper end of the interlayer dielectric film.

12. The manufacturing method of a semiconductor device according to claim 7, wherein a thickness of the first electrode layer is one half or more of a thickness of the metal electrode.

13. The manufacturing method of a semiconductor device according to claim 6, wherein in the first sputtering, the heating temperature is 400° C. or higher, and the DC sputtering power is 5 KW or lower.

14. The manufacturing method of a semiconductor device according to claim 13, wherein in the second sputtering, the heating temperature is 400° C. or higher, and the DC sputtering power is 5 KW or higher.

15. The manufacturing method of a semiconductor device according to claim 13, wherein a percentage of thickness of the first electrode layer and the second electrode layer, with respect to the total thickness of the metal electrode, depends on the heating temperature.

16. The manufacturing method of a semiconductor device according to claim 15, wherein the higher the heating temperature is, the greater a percentage of thickness of the second electrode layer to the first electrode layer is.

* * * * *